(12) United States Patent
Tsang

(10) Patent No.: US 7,838,875 B1
(45) Date of Patent: Nov. 23, 2010

(54) METAL TRANSISTOR DEVICE

(76) Inventor: Dean Z. Tsang, 26 Beacon St., #34F, Burlington, MA (US) 01803-3811

( * ) Notice: Subject to any disclaimer, the term of this patent is extended or adjusted under 35 U.S.C. 154(b) by 0 days.

(21) Appl. No.: 10/762,658

(22) Filed: Jan. 22, 2004

Related U.S. Application Data

(60) Provisional application No. 60/441,931, filed on Jan. 22, 2003, provisional application No. 60/477,983, filed on Jun. 12, 2003.

(51) Int. Cl.
*H01L 29/12* (2006.01)

(52) U.S. Cl. .................. 257/43; 257/213; 257/288

(58) Field of Classification Search .......... 257/43, 257/213, 288
See application file for complete search history.

(56) References Cited

U.S. PATENT DOCUMENTS

| | | | |
|---|---|---|---|
| 5,401,714 A * | 3/1995 | Chaudhari et al. ........ 505/193 |
| 6,365,913 B1 | 4/2002 | Misewich et al. ........... 257/43 |
| 6,458,695 B1 | 10/2002 | Lin et al. ................... 438/659 |
| 6,465,315 B1 | 10/2002 | Yu ............................. 438/306 |
| 6,504,174 B1 | 1/2003 | Yamazaki et al. ........... 257/64 |
| 6,809,379 B2 | 10/2004 | Kreupl ...................... 257/347 |
| 2002/0045319 A1* | 4/2002 | Ogura et al. .............. 438/303 |
| 2003/0155591 A1 | 8/2003 | Kreupl ...................... 257/288 |
| 2004/0149679 A1* | 8/2004 | Song et al. .................. 216/13 |
| 2004/0169227 A1* | 9/2004 | Wei et al. .................. 257/347 |
| 2004/0227154 A1* | 11/2004 | Chu et al. .................. 257/194 |

* cited by examiner

*Primary Examiner*—Long Pham
(74) *Attorney, Agent, or Firm*—Weingarten, Schurgin, Gagnebin & Lebovici LLP

(57) ABSTRACT

The present invention relates to a depletion or enhancement mode metal transistor in which the channel region of a transistor device comprises a thin film metal or metal composite layer formed over an insulating substrate.

24 Claims, 7 Drawing Sheets

METAL TRANSISTOR DEVICE

CROSS REFERENCES TO RELATED APPLICATIONS

The present application claims the benefit of U.S. Provisional Application No. 60/441,931, filed Jan. 22, 2003 and U.S. Provisional Application No. 60/477,983, filed Jun. 12, 2003. The entire contents of the above applications are incorporated herein by reference.

BACKGROUND OF THE INVENTION

As commercial integrated circuits push into 90-nm process technology with 50-nm gates and research devices push even smaller, further improvements in performance by scaling the channel length of transistors appear to be approaching the limits of scaling due to short channel, gate current leakage, and other effects. In particular, the power dissipation of integrated circuits is increasingly a problem as the transistor channel length is scaled down and transistors can no longer be completely shut off. Indeed the resulting increases in the off-state leakage current degrade the on-off current ratio. There are also short channel effects such as punch through and three dimensional effects that result from fringing and corners. Some researchers have suggested that the end to Moore's law, which has described the progression of silicon integrated circuit technology, is near. Others have suggested that entirely new technologies such as molecular electronics and carbon nanotube transistors are needed to prevent a slow-down in the improvement of electronics.

SUMMARY OF THE INVENTION

The present invention relates to a transistor that can further reduce feature size and improve transistor performance without discarding the investment in integrated circuit fabrication processes. Significant improvements in transistor and integrated circuit performance can be obtained with this device by building on the capabilities of silicon fabrication foundries rather than requiring a shift in manufacturing infrastructure as might be required by other technologies.

This high performance transistor/integrated circuit technology enables faster and lower power microprocessors for computers, larger memories, higher performance digital signal processing chips, more radiation resistant military and satellite electronics, lower cost microwave and wireless devices, and lower cost high-speed telecommunication electronics.

As noted previously, scaling has been very productive as a strategy to improve integrated circuit performance. Scaling feature sizes down with 90-nm process technology that is starting commercial production, will produce transistors with 50-nm gates and 1.2-nm thick gate oxides, which are only 5 atomic layers thick. Much of the effort to improve device performance focuses on reducing the leakage current due to short channel effects and gate leakage current and increase speed by improving mobility or transconductance.

Efforts to improve the transconductance in field-effect transistors range from the use of strained-silicon layers with high mobility in silicon integrated circuits to modulation-doped quantum well high electron mobility transistors (HEMTs) in III-V materials. The use of strain has been shown to improve the mobility of silicon materials. In III-V materials, a quantum well with lower energy gap material and low doping is placed into the channel and carriers fall into the well and are conducted in a two dimensional electron gas with low impurity scattering. The improvements obtained from these approaches result in increased mobility, transconductance $g_m$, and hence improved $g_m/C$ ratios, where C is the transistor input capacitance. Higher $g_m/C$ translates into improved operation at high frequencies. HEMTs are currently in commercial production and strained-layer silicon will soon be in production.

The present invention pertains to devices referred to herein as metal transistors. These devices are field effect devices with a thin metal channel. Advantages of the metal transistor include higher transconductance and improved high-speed operation. The high conductivity of the metal channel eliminates punch through effects even at gate lengths of 10 nm or less. In addition, the high conductivity of metal-to-metal source and drain contacts enables such contacts to be made in a small area relative to metal-semiconductor ohmic contacts. The thin metal channel makes three-dimensional effects less important. Metal transistors can therefore be expected to scale to smaller sizes than silicon devices. Furthermore, metal transistors not only can be made on silicon at densities common to silicon integrated circuits, but can also be integrated onto a variety of substrates, including optoelectronic and/or electro-optic materials.

The present invention relates to the use of thin highly conductive materials including metals and/or metal silicides to provide the channel region of a transistor or switching device. The channel region is sufficiently thin that a reverse bias between a gate and a source electrode depletes the channel of electrons to switch the transistor "off". A voltage between the source and drain with no gate voltage results in a current through the channel. When a reverse bias gate voltage is applied, gain is generated. A preferred embodiment of the invention comprises a thin film channel layer having a thickness of less than 5 nm. The metal channel is preferably continuous and can be formed using metals as silver, copper or platinum. The metal channel can also comprise a composite structure such as a plurality of layers of different metals or alloys to enable the selection of desired work function characteristics.

The foregoing and other features and advantages of the system and method for a thin film metal transistor will be apparent from the following more particular description of preferred embodiments of the system and method as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
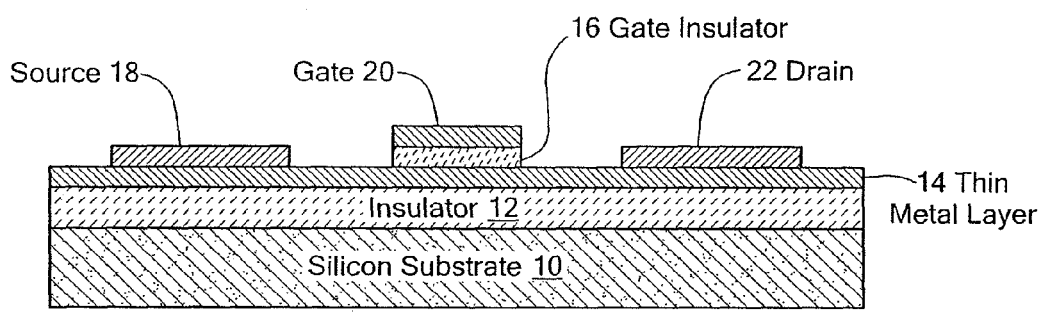
FIG. 1 is a schematic cross-sectional view of a preferred depletion-mode embodiment of the invention.

An invention is described herein to improve transconductance and reduce short channel effects over that of silicon transistors. A preferred embodiment of the invention uses a high conductivity metal instead of semiconductor material in the channel to create a high transconductance device. The conductivity of metals is far higher than that of semiconductors, even strained or undoped semiconductors and even small electric fields can produce very large current flow. The device can include a metal source 18, a nanolayer or subnanolayer metal channel 14, and a metal drain 22 on an insulating layer 12 and a substrate 10 as shown in FIG. 1. A thin gate insulator 16 and a metal gate 23 cover the channel region. Upon reverse bias between the gate and source, the thin metal channel can be depleted of electrons and the resistance of the channel will increase, if the channel is sufficiently thin. When the thin metal is completely depleted, the transistor can be completely shut off, much as a JFET or MOSFET can be shut off When a voltage is applied between the source and drain with no gate voltage, current will flow through the thin metal channel. When a reverse bias gate voltage is applied, the conductivity of the metal will change in response and a much larger voltage and current can be controlled to produce gain. Upon application of a positive gate voltage, it may even be possible to operate the device in an accumulation mode as more electrons accumulate under the gate due to electrostatic forces. The transistor is, therefore, a metal transistor (MT) and acts as a type of field effect transistor. This device has the on-state conductance of a metal and the off-state conductance of a carrier-depleted material. As metals have significantly higher conductivities than semiconductors, much higher on/off current ratios and transconductances can be provided.

This embodiment, which will be referred to as the depletion-mode device, operates in depletion and accumulation modes. Another embodiment, which will be referred to as an enhancement-mode device, operates by channel inversion and is described in further detail hereinafter.

The thickness of the thin metal channel is important and is preferably less than the depletion width for the depletion-mode device. The depletion approximation can be used to calculate the maximum thickness of the channel. A metal with $10^{22}$ cm$^{-3}$ electrons and a dielectric constant of 10 has a depletion width of about 1 nm with a net (externally applied potential less internal potential) voltage of 5 V. A material like copper can be depleted if the layer is sufficiently thin. Copper's atomic weight is 63.546 and it has a density of 8.96 g/cm$^3$. It can be calculated to have about $8.5 \times 10^{22}$ atoms/cm$^3$ and given an effective number of electrons per atom of 0.37, which gives about $3 \times 10^{22}$ electrons/cm$^3$. If such a material has a dielectric constant of between 3 and 10, it can be estimated to have a depletion width between 0.24 and 0.4 nm. This is enough for full depletion, although the thickness of the channel in this embodiment is only 1 or 2 atomic layers high conductivity materials such as metal silicides or other metals can be used to obtain a thicker channel. In general a channel thickness of less than 5 nm is preferred.

The current-voltage characteristics and transconductance of a metal transistor with gate length L can be calculated by consideration of the voltage V(y) in the y direction along the undepleted metal channel, where y=0 at the source edge of the gate and y=L at the drain edge of the gate. The channel has a uniform conductivity σ, a thickness T, and a width W. $V(d)=V_d$ is the applied drain voltage, $V_g$ is the gate voltage, and the voltage at the source V(0)=0. An element dy has a resistance dR given by $$dR = dy/[\sigma(T-d)W] \text{ for } d<T$$

where d(y) is the depletion width at position y $$d(y) = [2\epsilon_m(V(y)+\phi_b-V_g)/qN_e]^{1/2}$$

$\epsilon_m$ is the dielectric constant and is real for a depleted metal, q is the electron charge ($1.6 \times 10^{-19}$ coulomb), $N_e$ is the concentration of electron donors. In a monovalent metal that has one free electron per atom, $N_e$ is the number of atoms per unit volume. In a multivalent metal, $N_e$ is the number of atoms per unit volume multiplied by the number of free electrons per atom.

$$dV = I_d dR$$

where $I_d$ is the drain current and $\phi_b$ is an offset voltage that includes work function differences and built-in potentials. We can then integrate and find $$I_d = (\sigma WT/L)\{V_d - (2/3)[2\epsilon_m/(qN_eT^2)]^{1/2}[(V_d+\phi_b-V_g)^{3/2} - (\phi_b-V_g)^{3/2}]\}$$

This expression can be differentiated with respect to $V_g$ to find the transconductance gm $$g_m = (\sigma WT/L)[2\epsilon_m/(qN_eT^2)]^{1/2}[(V_d+\phi_b-V_g)^{3/2} - (\phi_b-V_g)^{3/2}]$$

Saturation occurs when $V_d$ is sufficiently large to cause the depletion region to extend through the full thickness of the channel T in the presence of a gate voltage. Expression for the saturated current and transconductance can be found, for example, the saturated transconductance can be found as $$g_{msat} = (\sigma WT/L)\{[1-2\epsilon_m V_g/(qN_eT^2)]^{1/2} - [(\phi_b-V_g)[2\epsilon_m/(qN_eT^2)]^{1/2}\}$$

As an example, a nonoptimized device with a 20 nm long, 1 mm wide gate can have a channel metal 0.32 nm thick with Ne=$10^{22}$ cm$^{-3}$, a conductivity of 100,000 S/cm (resistivity $10^{-5}$ ohm-cm) and a relative permittivity of 3. If Vg=−1.5 V and $\phi_b$=0.3 V, $g_{msat}$ will be 73,000 mS/mm. This can be compared to 350 mS/mm for a Si n-MOSFET with a 20 nm long gate at room temperature.

Thin metal films, however, have only a fraction of their bulk conductivity because the nonconducting interfaces limit the number of conducting carriers to those with acceptable wavevectors. The quantum mechanical correction factor is a function of the conducting layer thickness T relative to Λ the mean free path of the carrier.

$$\sigma/\sigma_o = [3T/(4\Lambda)][\ln(\Lambda/T)+0.423] \text{ for } T \ll \Lambda$$

where σo is the bulk conductivity. A film composed of a material like Pt with a thickness of 0.32 nm, which can be depleted with only 3 V, can have a mean free path of 10 nm. In this case, with a metal thickness of only 0.32 nm, the correction factor can be calculated to be about 0.1. The saturated transconductance after thin film correction is 7,300 mS/mm. The calculated transconductance is about 20 times better than silicon devices of comparable dimensions. The transconductance exceeds that projected for InGaAs high electron mobility transistors of comparable dimensions by a factor of two or three.

A transistor based on this structure can comprise a few atomic layers of metal followed by a few atomic layers of gate insulator and a thicker metal gate. The choice of materials is important because the depletion region in the device structure extends primarily into the channel and as little as possible into the gate to allow maximum channel width modulation at a given gate bias. The preferred channel, therefore, has a high electron mobility and preferably a lower electron concentration. The preferred gate metal has a high electron concentration while mobility is less important. The gate insulator is preferably formed from a low-current leakage dielectric material.

The metal in the channel can be either an n-type electron metal or a p-type hole metal. Use of n-channel and p-channel devices can be used to fabricate complementary digital circuit designs similar to CMOS where one or the other of the transistors is normally off except while switching logic states.

High on/off ratios can occur with metal channels if they are made longer than silicon transistors with the same transconductance. The device is less susceptible to soft errors caused by minority carriers that are generated along the path of ionizing radiation.

In digital applications if this charge exceeds a threshold, a soft error can occur. As with silicon on insulator (SOI) devices, the very small device volume of the MT makes it less susceptible to these problems relative to bulk silicon devices.

There have been related studies of metal quantum wells in an electric field and experimental work with thin metals in other devices. A study of energy levels in thin metal quantum wells under an electric field by Jaklevic and Lambe noted that the energy shifted higher than predicted. Such an effect can be with consistent with partial depletion of the quantum well. Two-dimensional quantum well effects as studied by Jaklevic and Lambe can also be present in the device, although along the plane of the quantum well the carriers are free. Thin metallic layers have also been of interest to researchers developing metal base hot electrons and spin transistors. In this invention, the metallic layer is applied in a field-effect device as opposed to the tunneling, hot electron, or spin effects in other devices.

It is known that Ag- and Pb-metal layers exhibit high conductivity. The percolation threshold above which the conductivity becomes metallic was observed at an average thickness of 0.7 monolayers or greater. Below this percolation threshold, the metal is not a continuous layer. The region below the percolation threshold is not of interest for the metal transistor device. At a thickness of 2 to 3 monolayers, Ag has a conductivity of 7000 to 10,000 S cm$^{-1}$ at 90° K. These experimentally measured numbers are consistent with the previously calculated conductivity of 10,000 S cm$^{-1}$ for a 0.32 thick film of Pt. Details about the experiments can be found in M. Henzler, O. Pfennigtorf, K. Land, T. Luer, F. Moresco, and T. Hildebrand, Structure and electronic properties of epitaxial metallic monolayers, Surface Science 438 178-184 (1999), the entire contents thereof being incorporated herein by reference.

A process for depletion-mode metal transistor fabrication is depicted schematically in a series of cross sectional views (FIGS. 2A-2J). Alternative methods known to persons skilled in the art of semiconductor device fabrication can also be used.

Figure 2A:
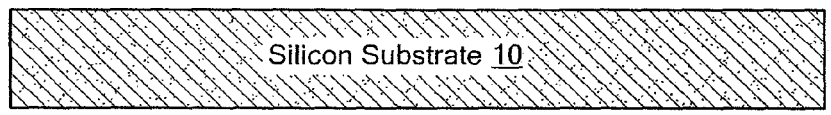
FIGS. 2A-2J are cross sectional views illustrating a process sequence for depletion-mode metal transistor fabrication.

The substrate 10 shown in FIG. 2A can be any smooth conducting, semiconducting or insulating material that is of sufficient thickness to provide mechanical support for electronic devices and is compatible with semiconductor processing equipment. Materials, which include silicon, sapphire, quartz, gallium arsenide, indium phosphide, or diamond can be selected based on the overall requirements of the devices to be integrated with the transistor. For example, silicon or sapphire substrates can be used with other silicon devices while gallium arsenide or indium phosphide substrates can be selected for integration with lasers or detectors. The substrate must be cleaned through a combination of chemical cleaning, chemical etching, sputter etching, plasma cleaning and clean handling as to allow deposition and adhesion of an insulator layer.

Figure 2B:
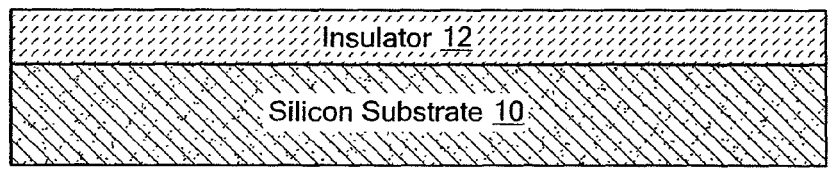

A layer of low-current leakage insulating material 12 is formed on the substrate as shown in FIG. 2B. Such materials include silicon dioxide, silicon nitride, or a combination thereof, aluminum oxide, or sapphire. Various techniques can be used to form this layer. Silicon dioxide can be grown on silicon by thermal oxidation, for example, while deposition of sapphire onto sapphire substrates may not be necessary. The insulating material is preferably formed to be sufficient quality and thickness to achieve low current leakage. The thickness can be in the 0.1- to 2-micrometer range for example.

Figure 2C:
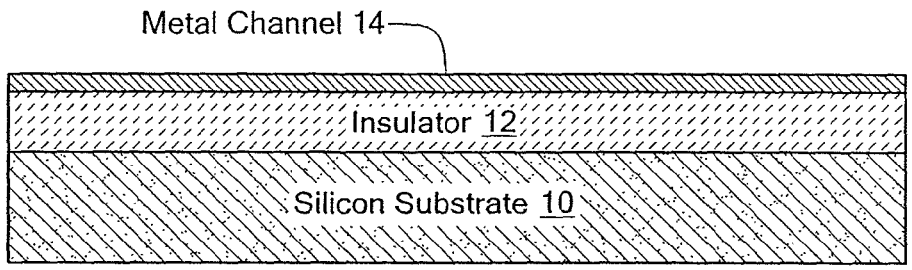

The metal channel is formed on the insulator from a highly conductive material such as metals, metal alloys, doped metals and layered metals. Highly conductive silicides, salicides or nitrides can also be used in additional embodiments. The metal layer 14 formed as shown in FIG. 2C is sufficiently thin to allow the metal to be completely depleted of carriers upon application of a control voltage to the gate. Typically this channel thickness is in the range of 0.2 to 3 nm. Thicker layers with more tolerance to thickness variations are possible if a low carrier concentration metal is used. A metal with high carrier mobility is desirable. The metal can be either an electron metal or a hole metal.

The insulator can be cleaned using techniques such as clean handling, chemical cleaning, chemical etching, sputter etching, and plasma cleaning as to allow deposition and adhesion of a continuous thin metal layer. The metal material can be deposited by a variety of techniques such as molecular beam epitaxy, chemical beam epitaxy, metal organic chemical vapor deposition or atomic layer deposition for single crystal metal or by sputtering, electron beam evaporation, or thermal evaporation if single crystal material is not necessary. Metals that can be oxidized have the advantage that the overlying gate insulator can be formed by oxidation. Hafnium, tantalum, titanium, and aluminum are metals that have good adhesion as well as candidate oxides for the gate insulator.

Figure 2D:
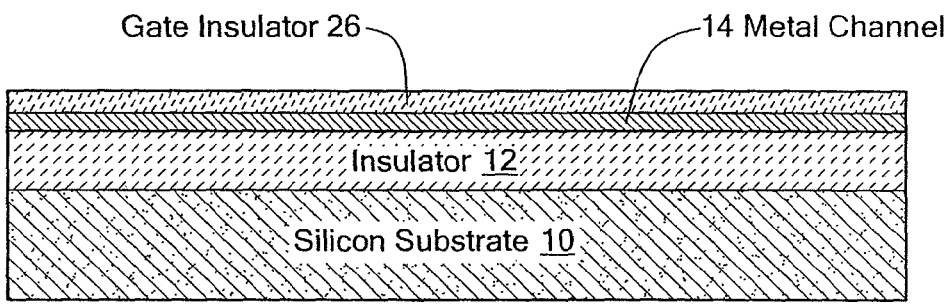

The gate insulator 26 can be a high quality, low leakage material, preferably with high dielectric constant, that is compatible with both metal layers. Materials such as silicon dioxide, silicon oxynitride, hafnium oxide, tantalum oxide or aluminum oxide can be used. This material preferably has very low mobile charge to prevent ionic conduction and drift. Oxidation or plasma deposition, chemical vapor deposition, electron beam evaporation, sputtering, jet vapor deposition, atomic layer deposition, or thermal evaporation can be used to deposit this material as shown in FIG. 2D. For certain applications, one can use molecular beam epitaxy, chemical beam epitaxy, or metal organic chemical vapor deposition to grow single crystal insulating layers as well.

Figure 2E:
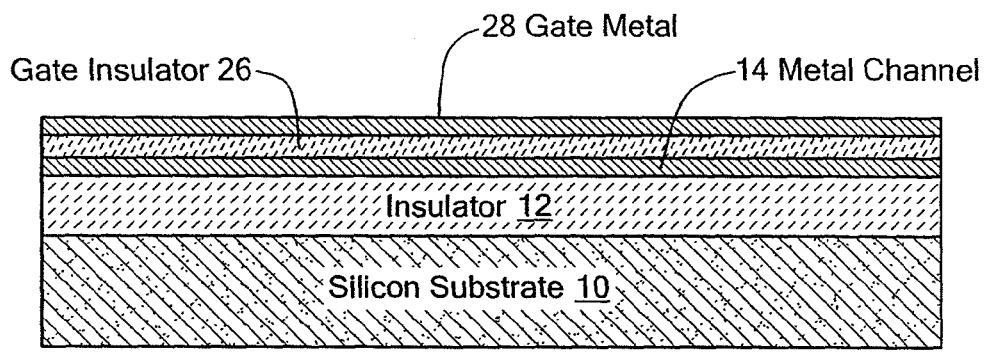
Figure 2F:
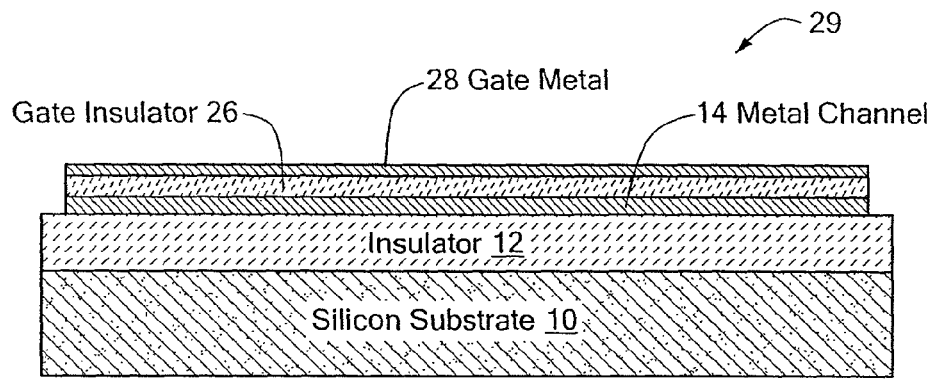

The gate metal 28 preferably has a high electron concentration for maximum depletion width modulation of the metal channel with applied voltage. Carrier mobility is less important in this layer. The gate need not be single crystal metal so that sputtering, electron beam evaporation, or thermal evaporation can be used to deposit a gate layer as shown in FIG. 2E. The gate may also be single crystal, and techniques such as molecular beam epitaxy, chemical beam epitaxy, or metal organic chemical vapor deposition may be used. The gate is preferably sufficiently thick to avoid carrier depletion and, therefore, is preferably at least several nanometers thick. Islands 29 are then formed as seen in FIG. 2F.

Figure 2G:
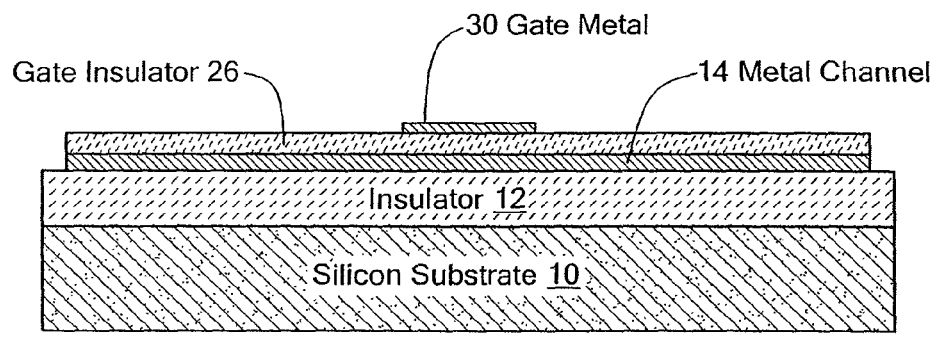

Metal transistor gates 30 can be photolithographically patterned as shown in FIG. 2G followed by selective etching of the gate metal layer. This step can also include etching the gate oxide, although it may be advantageous to leave the gate oxide intact to preserve the metal oxide interface. An alternative approach is to use photolithography and liftoff to pattern the gate.

Figure 2H:
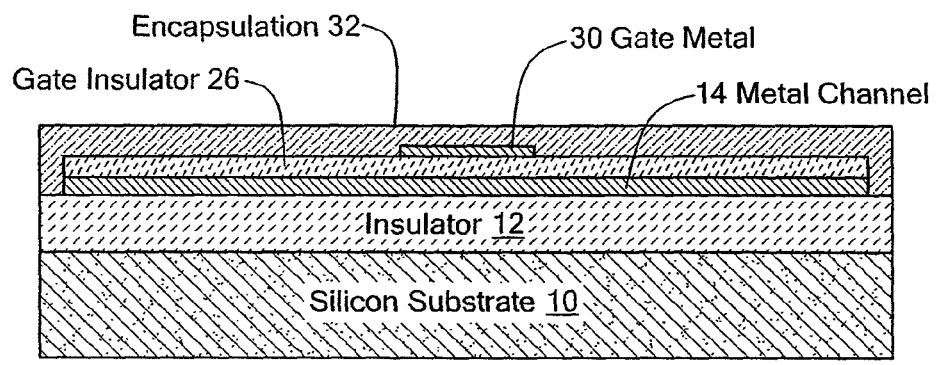

An encapsulation layer 32 can be deposited by means including plasma deposition, chemical vapor deposition, electron beam evaporation, sputtering, or thermal evaporation as shown in FIG. 2H. Plasma or chemical vapor deposition is advantageous because of relatively high deposition rates at low temperatures.

Figure 2I:
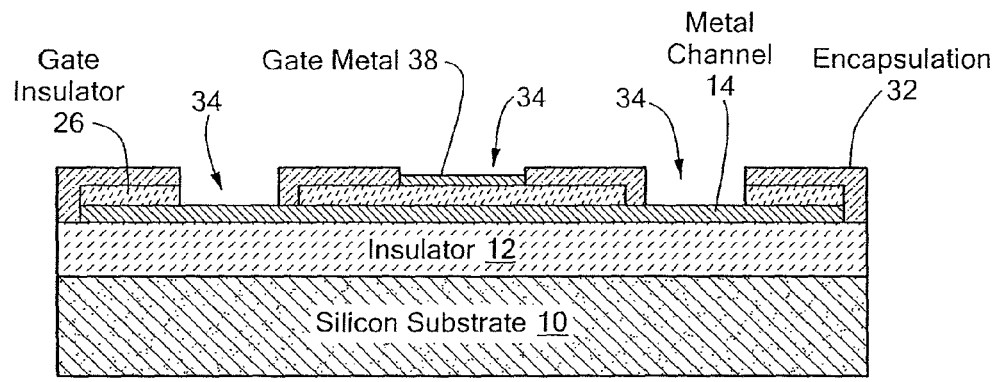

Source, gate, and drain electrical contacts have to be made in openings 34 through the encapsulation layer and the gate insulator layer. Photolithographic patterning followed by dry etching or even wet chemical etching can make these openings, depending on the size of the opening as illustrated in FIG. 2I.

Figure 2J:
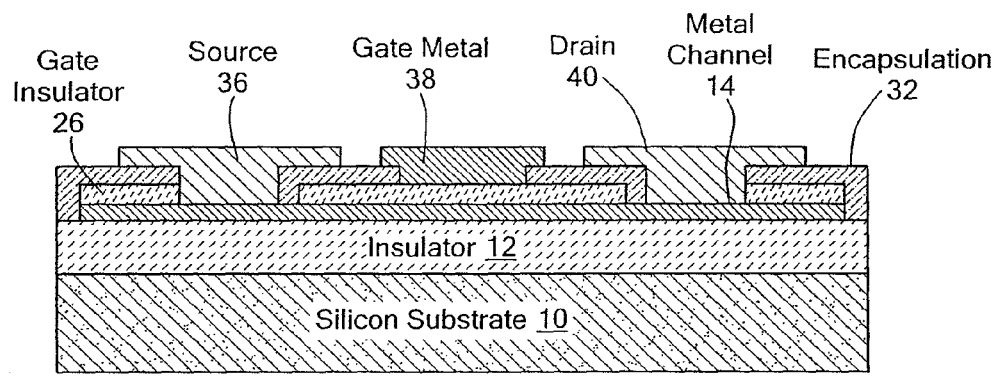

Metal can be deposited and patterned with photolithography and etching to leave source 36, gate 38, and drain 40 contact metallization as seen in FIG. 2J. Alternatively photolithography followed by metallization and liftoff can also be used. Ohmic contacts to the source and drain are necessary.

Figure 3:
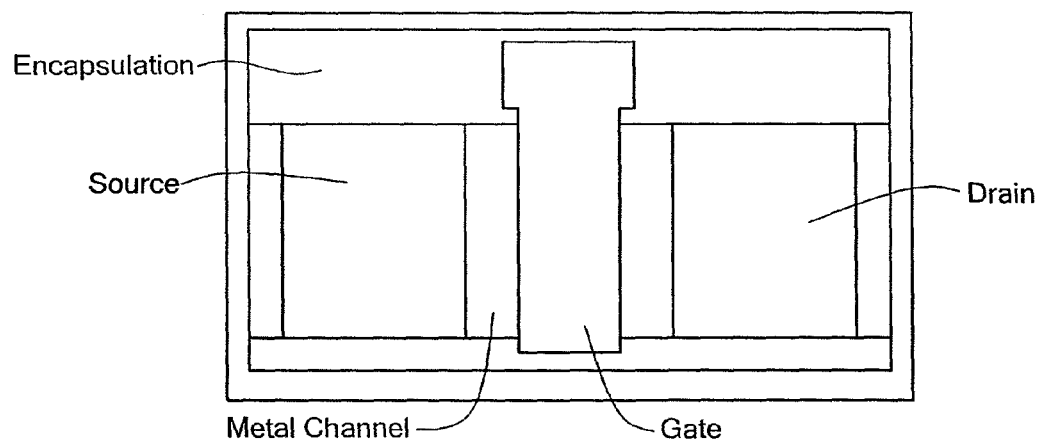
FIG. 3 is a schematic top view of this invention.

Photolithography followed by selective etching of layers, can be used to form individual transistor devices as shown schematically in the top view in FIG. 3. For electrical isolation the thin metal layer between adjacent transistors must be completely removed.

Figure 4:
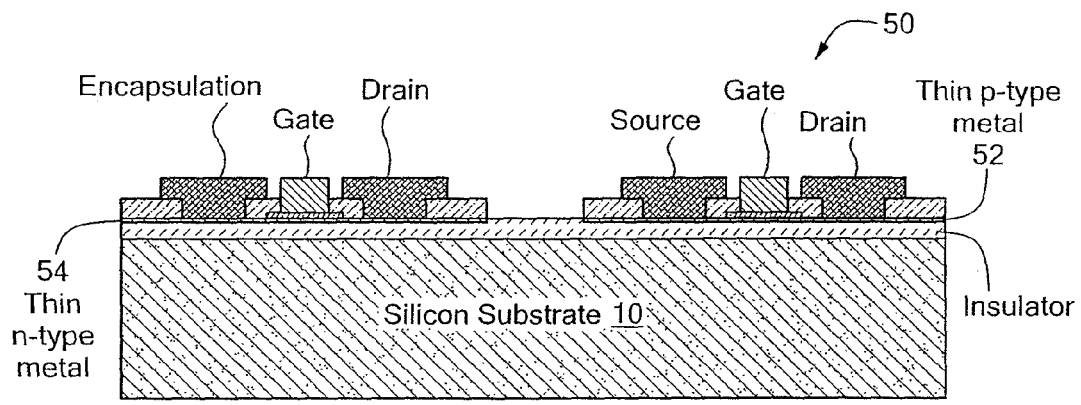
FIG. 4 is a cross-sectional view of a complementary version of the present invention. Either p-channel MOSFETs or p-channel metal transistors, as shown, can be integrated with n-channel metal transistors for complementary circuit designs.

The electron metal transistor may be integrated with p-channel silicon MOSFETs to form complementary type circuits 50 as illustrated in FIG. 4. In this case it may be advantageous to start with a silicon on insulator (SOI) wafer with p-channel MOSFETs 52 already formed and proceed from steps from FIG. 2C through the step of FIG. 2F to integrate the n-channel metal transistor 54. Depending on the metals involved, a choice can be made to integrate the silicon device after the metal transistor.

For both n- and p-channel metal transistors, steps in FIGS. 2A through 2F can be performed with an electron metal, then the steps for deposition of the channel through gate insulator formation can be repeated with a p-type metal or hole metal, another gate insulator, and another gate metal layer can be deposited. The advantage of depositing the electron metal first is that there is a wider choice of electron metals. A metal can therefore be selected for best processing compatibility with the hole metal. The order of electron and hole metal formation can also be reversed with the p-type metal deposited first. The description applies to patterning both p- and n-channel metal transistors. Details on p-type metals can be found in R. Berger and F. Van Bruggen, A p-type metal with a layer structure. J of the Less Common Metals, 99(1) 113-123, 1984, the entire contents of which is incorporated herein by reference.

Ohmic contacts between p-type metal and an electron metal can be made by either a sharp transition or possibly over a gradual transition. Alternatively, it may be preferable to use microalloying or sintering techniques to form electrical contacts to the p-channel material.

The choice of materials is important because the depletion region in the device preferably extends primarily into the metal channel and as little as possible into the gate to allow maximum channel width modulation at a given gate bias. The preferred channel, therefore, has high electron mobility and lower electron concentration. The preferred gate metal has high electron concentration while mobility is less important. In addition, the work functions of the materials will influence the threshold voltage of the transistors. The gate insulator is preferably formed from a low-current leakage dielectric material.

Poisson's equation can be solved with use of the depletion approximation to calculate the channel depletion width in a uniform metal with electron donor concentration Ne as a function of applied voltage.

$$d=(2VsK\in_o/q)^{1/2}$$

q is the electron charge $1.6\times10^{-19}$ coulomb, K is the relative dielectric constant of the metal and $\in_o$ is the permittivity of free space, and Vs is the metal potential at the gate insulator/ thin metal interface. While metals have a complex dielectric constant, K is real for a metal depleted of free carriers. In a monovalent metal that has one free electron per atom, Ne is the number of atoms per unit volume. In a multivalent metal, Ne is the number of atoms per unit volume multiplied by the number of free electrons per atom. Vs is related to the gate voltage Vg through $$Vs=Kox(V_g-\phi_b)/(Kox+Kdox/d)$$

where Kox and dox are the relative dielectric constant and thickness of the gate insulator respectively. The gate insulator thickness is preferably as thin as possible while keeping leakage including tunneling currents negligible. $\phi_b$ is an offset that includes work function differences and built-in potentials.

Figure 5:
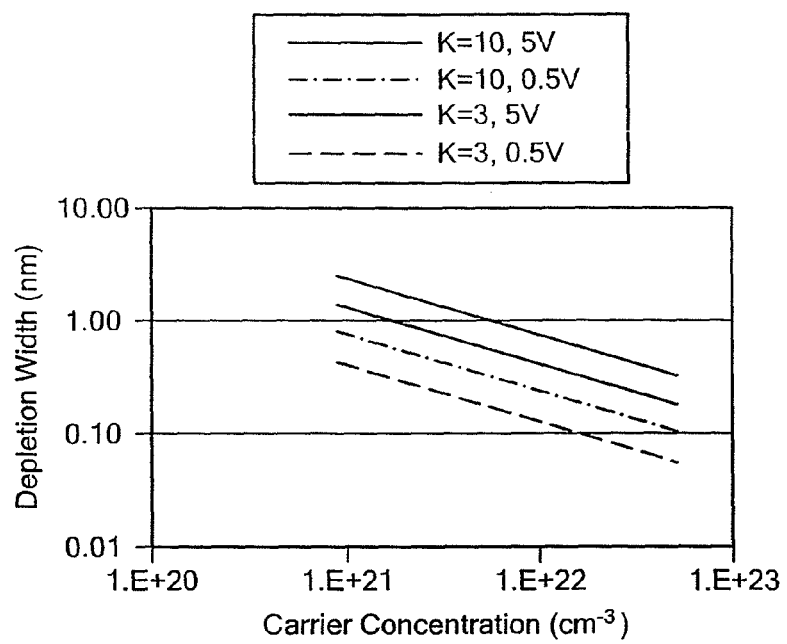
FIG. 5 is a graphical illustration of examples of depletion width as a function of carrier concentration in the channel shown for different values of relative dielectric constant K and effective voltage V.

The depletion approximation can be used to calculate the channel depletion width as a function of applied voltage. As noted earlier, the channel thickness is preferably less than the depletion width of the channel at the operating voltage. This allows the channel to be fully depleted at the designed operating voltage. The determination of the depletion voltage depends on detailed knowledge of the carrier concentration and dielectric constant of the materials in the structure. FIG. 5 shows an example for the case of a gate metal that has much higher carrier concentration than the channel, an infinitesimal gate oxide thickness and a uniform dielectric constant K throughout the structure. V is an effective voltage including any built-in potential. The actual depletion width will vary from this depending on the actual structure of the device. A detailed calculation including built-in voltage involves the work functions of the metals used for the channel and gate. These work functions will also determine the threshold of the transistor.

Scaling gate lengths to 10 nm or less is easily possible with the metal transistor. Punch through effects that occur when the electric field depletes the channel between drain and source are not an issue down to gate lengths as short as the depletion width in the channel. The high conductivity of the metal channel therefore eliminates punch through effects at gate lengths of 10 nm or less and scaling limits can be extended to the sub-nm to several nm range before punch through effects again become important.

The gate width preferably exceeds the channel width to ensure full channel depletion. The channel width is dependent on design requirements. The current handling capability and the off-state leakage current can be expected to scale with channel width. The on state resistance also drops with increasing channel width. For highest circuit density and lowest power dissipation, the transistor is made as small as possible consistent with driving the capacitive load imposed by the load within the switching time required.

A transistor based on this structure can include a few atomic layers of metal followed by a few atomic layers of insulator and a thicker metal gate. Gate lengths can be in the range of 5 nm to 50 nm with channel widths in the range of 50 to 500 nm.

Figure 6:
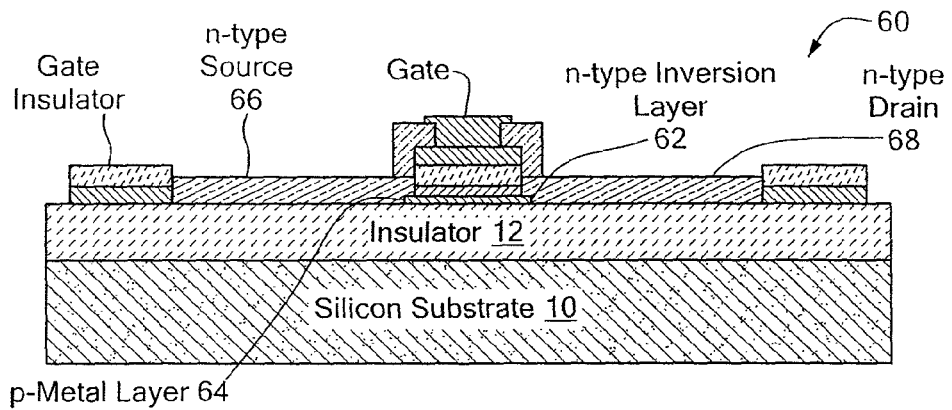
FIG. 6 is a cross-sectional view of an enhancement-mode embodiment of this invention.

In another embodiment of this invention, enhancement-mode devices 60 with a thin inversion layer in metal can be made. An n-channel enhancement-mode device, for example, can be fabricated by forming a structure with n-type source 66 and drain 68 regions and p-type metal 64 under the gate and gate oxide as shown schematically in FIG. 6. Upon application of sufficiently positive gate voltage, electrons form an extremely thin n-type inversion layer 62 on the gate side of the p-metal layer. This inversion layer is a conducting channel between source and drain that is created by gate bias and which disappears at zero bias. The thickness of the metal layer must be thicker than the inversion layer and the accompanying depletion layer in this embodiment. In this type of device, low carrier concentration materials in the drain and in the metal under the gate will increase the breakdown voltage at the drain p-n junction and facilitate channel inversion. Grading the source and drain p-n junctions reduces tunneling, unless such tunneling is desirable for special device characteristics.

Figure 7A:
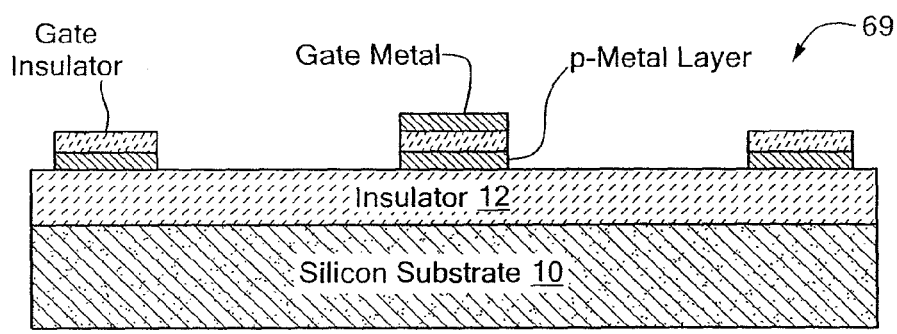
FIGS. 7A-7E is a series of cross-sectional views illustrating a process sequence for an enhancement-mode embodiment of this invention.
Figure 7B:
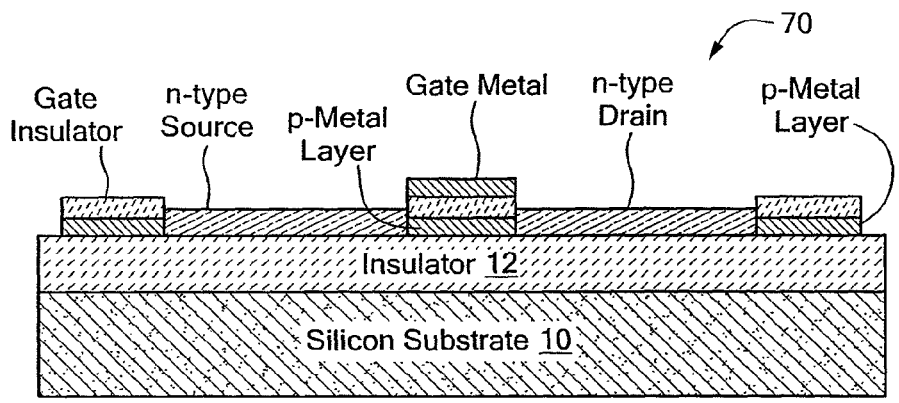
Figure 7C:
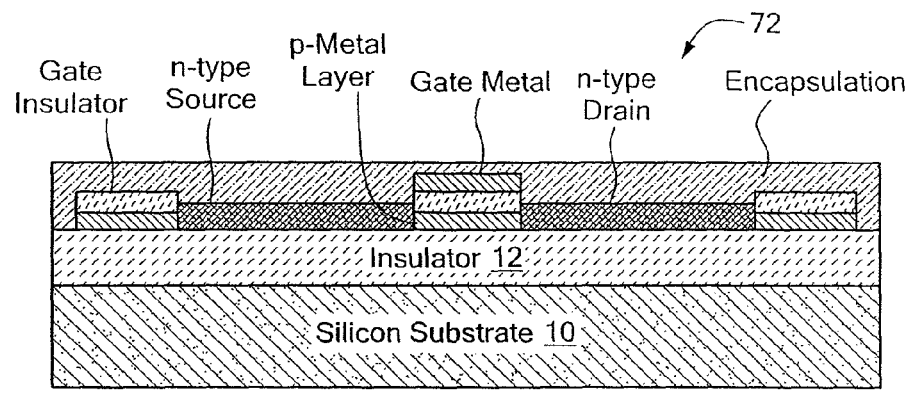
Figure 7D:
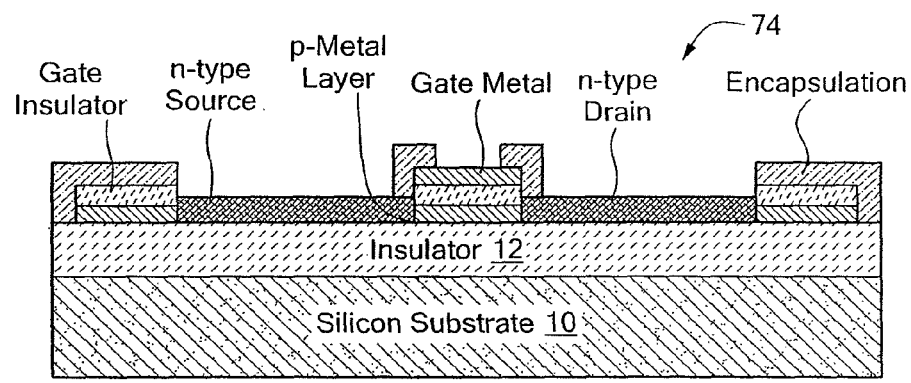
Figure 7E:
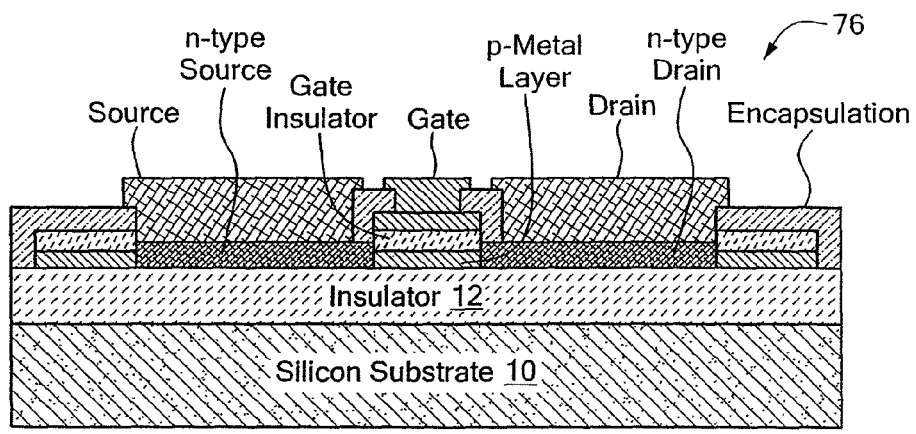

A fabrication sequence for an n-channel device with metal source and drain is shown in FIGS. 7A-7E. The process description from FIGS. 2A-2F provides the first six steps followed by patterning device 69 in FIG. 7A where the gate and gate oxide are etched, then the metal in the source and drain regions are removed through techniques such as photolithography and dry etching. The processes in FIGS. 2F and 7A can be combined but are shown separately in this description. Processes such as e-beam evaporation and selective etching or liftoff can be used to deposit 70 complementary type material in the source and drain regions, as shown in FIG. 7B. In FIG. 7C, the device 72 is encapsulated with an insulator followed by etching to open contact windows 74 as shown in FIG. 7D. Finally, contact metallization 76 is formed for the source, drain and gate as illustrated in FIG. 7E.

Similar methods can be used to form the p-channel enhancement-mode device, which can be made with p-type source and drain regions with n-type metal under the gate. Similar to FIG. 4, both n- and p-channel enhancement-mode devices can be integrated on the same substrate to produce complementary type digital circuit operation in which either the n- or p-channel transistor in a stage is off except during logic transitions.

Semiconductor material can be used in the drain region, instead of metal, for low carrier concentration, however, the channel is within a thin metal layer. The process sequence can be altered for devices with semiconductor source and drain regions because those regions are more easily formed prior to deposition of the thin metal layer.

Device dimensions similar to those of the depletion-mode device apply except that the thin metal layer is preferably thicker than the combined thickness of the inversion layer and depletion layer or about 0.2 to 5 nm depending on carrier concentration.

The claims should not be read as limited to the described order or elements unless stated to that effect. Therefore, all embodiments that come within the scope and spirit of the following claims and equivalents thereto are claimed as the invention.

What is claimed:

1. A field effect transistor device comprising:
   an n-type metal channel formed over an insulator, the metal channel further comprising a continuous thin conductive film having a thickness less than 5 nm, and wherein the n-type metal is a material selected from the group consisting of a pure metal, a composite of pure metals, a metal alloy consisting of two or more pure metals, a doped pure metal, layered pure metals, a conductive metal silicide, a conductive metal salicide and a conductive metal nitride;
   a source including a p-type material and a drain including a p-type material; and
   a gate and a gate insulator formed over the channel, the gate controlling carriers in the channel.

2. The device of claim 1 wherein the insulator further comprises an insulating layer over a substrate, the metal channel being positioned between the gate and the insulating layer and the gate insulator being positioned under the gate and over the metal channel.

3. The device of claim 1 further comprising a silicon substrate.

4. The device of claim 1 wherein the device further comprises a complementary transistor device.

5. The device of claim 1 further comprising an encapsulation layer.

6. The device of claim 1 wherein the metal channel has a length in a range of 5 nm to 50 nm and a width in a range of 50 nm to 500 nm.

7. The device of claim 1, further comprising a p-type inversion layer.

8. The device of claim 1, wherein a p-type inversion layer is formed on the n-type metal upon application of a negative gate voltage.

9. The device of claim 8, wherein a thickness of the n-metal layer is greater than a thickness of the p-type inversion layer.

10. The device of claim 8 wherein the p-type inversion layer is on a first side of the n-type metal to form a p-channel enhancement-mode device.

11. A transistor device comprising:
    a source;
    a drain;
    a gate; and
    a p-type hole metal channel having a thickness of less than 5 nm with the channel being positioned relative to the gate such that the carriers in the channel are controlled by the gate, the metal channel comprising a material selected from the group consisting of a pure metal, a doped pure metal, a composite of pure metals, a metal alloy consisting of two or more pure metals, layered pure metals, a conductive metal salicide, a conductive metal salicide and a conductive metal nitride.

12. The device of claim 11 further comprising an insulating layer and a gate insulator, the metal channel being positioned between the gate insulator and the insulating layer.

13. The device of claim 11 wherein the transistor comprises an enhancement mode device.

14. The device of claim 11 wherein the transistor comprises a depletion mode device.

15. A field effect transistor device comprising:
    an n-type metal channel formed over an insulator, the metal channel further comprising a material selected from the group consisting of a pure metal, a composite of pure metals, a metal alloy consisting of two or more pure metals, a doped pure metal, layered pure metals, conductive metal salicides, conductive metal salicides and conductive metal nitrides;
    a source including a p-type material and a drain including a p-type material; and
    a gate and a gate insulator formed over the channel, the gate controlling carriers in the channel.

16. A field effect transistor device comprising:
    an n-type metal channel formed over an insulator, the metal channel further comprising a continuous thin conductive film having a thickness less than 5 nm, and wherein the n-type metal is a material selected from the group consisting of a pure metal, a composite of pure metals, a metal alloy consisting of two or more pure metals, a doped pure metal, and layered pure metals;

a source including a p-type material and a drain including a p-type material; and a gate and a gate insulator formed over the channel, the gate controlling carriers in the channel.

17. The device of claim 16 wherein the metal channel has a conductivity in a range above 7000 S/cm.

18. A transistor device comprising:
a source;
a drain;
a gate; and
a p-type hole metal channel having a thickness of less than 5 nm with the channel being positioned relative to the gate such that the carriers in the channel are controlled by the gate, the metal channel comprising a material selected from the group consisting of a pure metal, a doped pure metal, a composite of pure metals, a metal alloy consisting of two or more pure metals, layered pure metals.

19. The device of claim 18 wherein the metal channel has a conductivity in a range above 7000 S/cm.

20. The device of claim 15 wherein the channel has a thickness of less than 5 nm.

21. The device of claim 11 wherein a type of carriers within the metal channel is controlled by the gate.

22. The device of claim 11 wherein the source comprises a p-type metal and the drain comprises a p-type metal, and wherein the metal channel is a p-type metal that is sufficiently thin that the number of carriers within the metal channel can be controlled by a gate to form a p-channel depletion-mode device.

23. The device of claim 11 wherein the source comprises an n-type metal and the drain comprises an n-type metal; and wherein the metal channel comprises a p-type metal such that an n-type inversion layer is formed on the p-type metal upon application of sufficient positive gate voltage to form an n-channel enhancement-mode device.

24. The device of claim 11 wherein the device further comprises a transistor of opposite conductivity type on a common substrate to form a complementary circuit.

* * * * *